United States Patent [19]

Kuki et al.

[11] Patent Number: 5,287,318
[45] Date of Patent: Feb. 15, 1994

[54] SEMICONDUCTOR MEMORY

[75] Inventors: Masaru Kuki, Osaka; Yukio Kitaguchi, Nara, both of Japan

[73] Assignee: Sharp Kabushiki Kaisha, Osaka, Japan

[21] Appl. No.: 836,023

[22] Filed: Feb. 14, 1992

[30] Foreign Application Priority Data

Feb. 15, 1991 [JP] Japan .................................. 3-21879

[51] Int. Cl.$^5$ .......................... G11C 7/00; G11C 16/00
[52] U.S. Cl. .................................... 365/218; 365/185; 365/201; 365/230.06; 365/900
[58] Field of Search ........... 365/218, 185, 201, 230.06, 365/900, 230.04

[56] References Cited

U.S. PATENT DOCUMENTS 4,903,236 2/1990 Nakayama et al. ............. 365/218 X
5,060,195 10/1991 Gill et al. ............................ 365/185
5,095,461 3/1992 Miyakawa et al. ................. 365/185

Primary Examiner—Eugene R. LaRoche
Assistant Examiner—Do Hyun Yoo
Attorney, Agent, or Firm—Morrison & Foerster

[57] ABSTRACT

In a flash-type electrically erasable programmable read-only memory (EEPROM), the erasure block decoder provided in the row decoder outputs a signal for simultaneously driving half the erasure line drivers in the erasure line driver array, or a signal for simultaneously driving the other half of the erasure line drivers in the erasure line driver array, according to an externally applied address signal. Therefore, the erasure operation test of all the blocks corresponding one-to-one to the erasure line drivers can be completed in two erasure operations, one for each corresponding half of the memory.

2 Claims, 5 Drawing Sheets

/Ai INDICATES Ai INPUT OR COMPLEMENT /Ai INPUT
(i = 7~16)

SEMICONDUCTOR MEMORY

BACKGROUND OF THE INVENTION

1. Field of the Invention

The present invention relates generally, as is indicated, to a semiconductor memory and more particularly to an electrically erasable programmable read-only memory (EEPROM). Even more particularly, the present invention relates to a flash-type EEPROM which is a block-erasure-type EEPROM.

2. Description of the Prior Art

Generally, the design of flash-type EEPROMs, is based on that of EEPROMs. Therefore, the contents of flash-type EEPROMs can be written in and erased electrically. In flash-type EEPROMs in particular, erasure can be achieved only as a chip or in units of blocks.

According to the prior art, to test the operation of each block in a semiconductor memory formed from a flash-type EEPROM, a "0" initially is written to all memory cells. Thereafter, the blocks whose contents are to be erased are selected one by one, so as to perform an erasure operation test on a block-by-block basis while checking that the blocks whose contents are to be erased do not interfere with other blocks.

However, in the above prior art semiconductor memory formed from a flash-type EEPROM, it takes about one second to erase the contents of one block regardless of the size of the block. As is noted above, the blocks whose contents are to be erased are selected one by one for an erasure operation test. Therefore, if the semiconductor memory has N blocks, it takes about N×1 seconds to complete the erasure operation test of all the blocks. As a result, in the case of a semiconductor memory having a 1-megabit storage capacity with a 4-kilobyte block size, the erasure operation test takes as long as 32 seconds. This presents the problem that the cost of an erasure operation test, at least with respect to time, is extremely high.

Accordingly, there is a strong need in the art for a semiconductor memory that can be tested for erasure operation in a shorter time and, therefore, can reduce the cost associated with an erasure operation test.

The present invention overcomes the aforementioned and other shortcomings of the above known and similar semiconductor memories. The present invention is summarized and described in detail below.

SUMMARY OF THE INVENTION

According to one aspect of the present invention, a semiconductor memory is provided which includes an EEPROM cell array having a plurality of blocks each consisting of a plurality of EEPROM cells. An erasure line driver array is included having a plurality of erasure line drivers corresponding one-to-one to the blocks and driven to erase the contents of the EEPROM cells in the corresponding blocks. A row decoder is included in the semiconductor memory for decoding external address signals and thereby selecting a particular EEPROM cell during a read operation and driving a selected erasure line driver during a block erasure operation. Such a row decoder has an erasure block decoder which, when an external test signal is given, outputs a signal for simultaneously driving all the even-numbered erasure line drivers in the erasure line driver array, or a signal for simultaneously driving all the odd-numbered erasure line drivers in the erasure line driver array, according to an externally applied address signal.

Accordingly, when an external test signal is given, the erasure block decoder provided in the row decoder outputs a signal for simultaneously driving all the even-numbered erasure line drivers in the erasure line driver array, or a signal for simultaneously driving all the odd-numbered erasure line drivers in the erasure line driver array, according to an externally applied address signal. Therefore, the erasure operation test of all the blocks corresponding one-to-one to the erasure line drivers can be completed in two erasure operations, one for the even-numbered blocks and the other for the odd-numbered blocks. Thus, the present invention achieves a reduction in the erasure operation test time and thence in the erasure operation test cost, compared with the prior art that requires testing of the blocks one by one.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
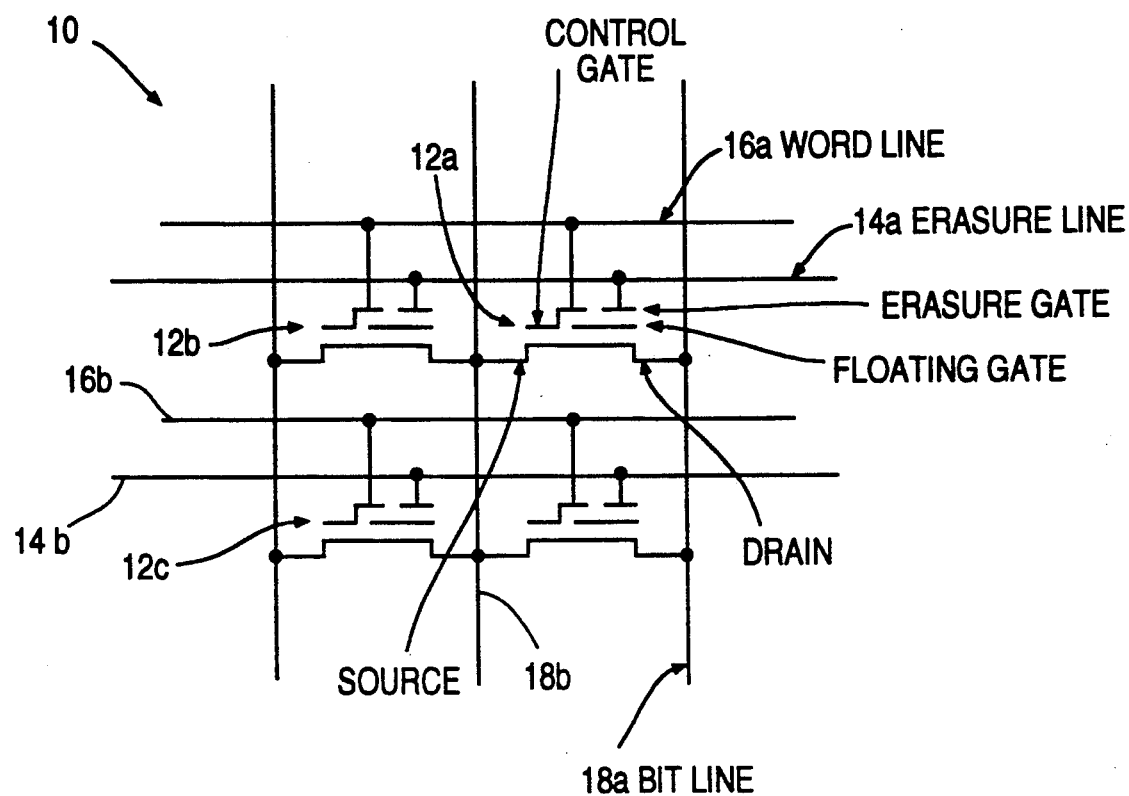
FIG. 1 is a circuit diagram showing a portion of an EEPROM cell array in accordance with the present invention.

The preferred embodiments of the present invention will now be described with reference to the accompanying drawings wherein like reference numerals are used to refer to like elements throughout.

Figure 2:
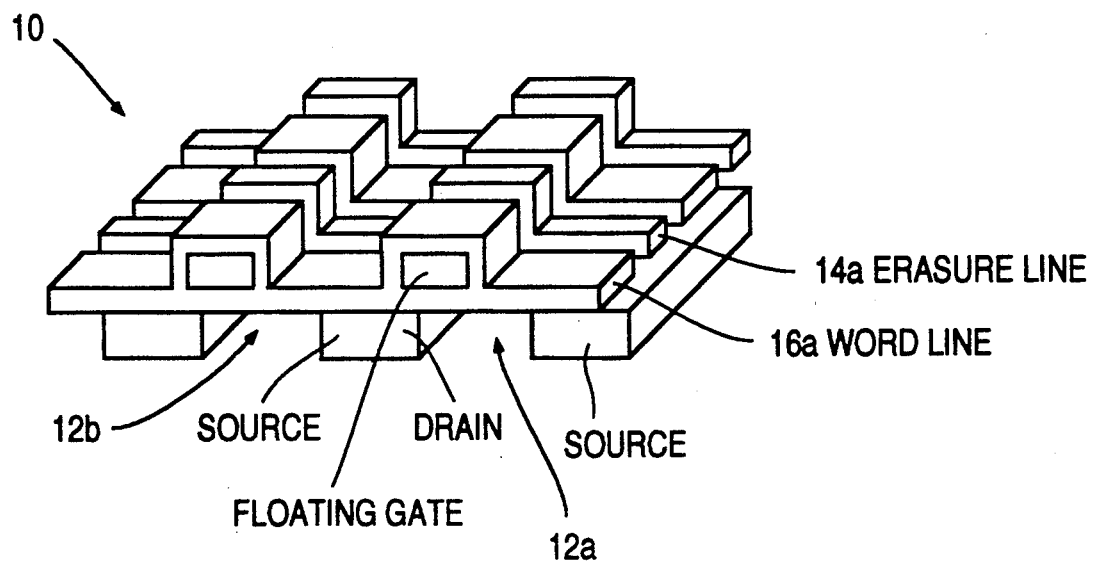
FIG. 2 is a schematic diagram of the EEPROM cell array of FIG. 1 in accordance with the present invention.

FIG. 1 is a circuit diagram showing a portion of an EEPROM cell array 10 of a semiconductor memory according to one embodiment of the invention. FIG. 2 is a schematic diagram of a portion of the EEPROM cell array 10. As shown in FIGS. 1 and 2, an erasure gate of an EEPROM cell 12a in the EEPROM cell array 10 is connected to an erasure line 14a. The control gate of the EEPROM cell 12a is connected to a word line 16a, while the source and drain thereof is connected to bit lines 18b and 18a, respectively. Table 1 shows exemplary set voltage values applied to the word line 16a, bit line 18a, and erasure line 14a connected to the EEPROM cell 12a selected from the EEPROM cell array 10 for data read, data write, and data erasure in the EEPROM cell. When the EEPROM cell 12a is not selected, the set voltage values are all 0V. Similar use of other word lines, bit lines, erasure lines (i.e., 16b, 18b, 14b, respectively) allow other EEPROM cells (i.e., cells 12b, 12c) to be selected as will be appreciated.

TABLE 1

|  | Word Line (volts) | Bit Line (volts) | Erasure Line (volts) |
|---|---|---|---|
| Read | 5 V | 2 V | 0 V |
| Write | 12 V ($V_{PP}$) | 8 V | 0 V |
| Erase | 0 V | 0 V | 40 V ($V_{EE}$) |

Figure 3:
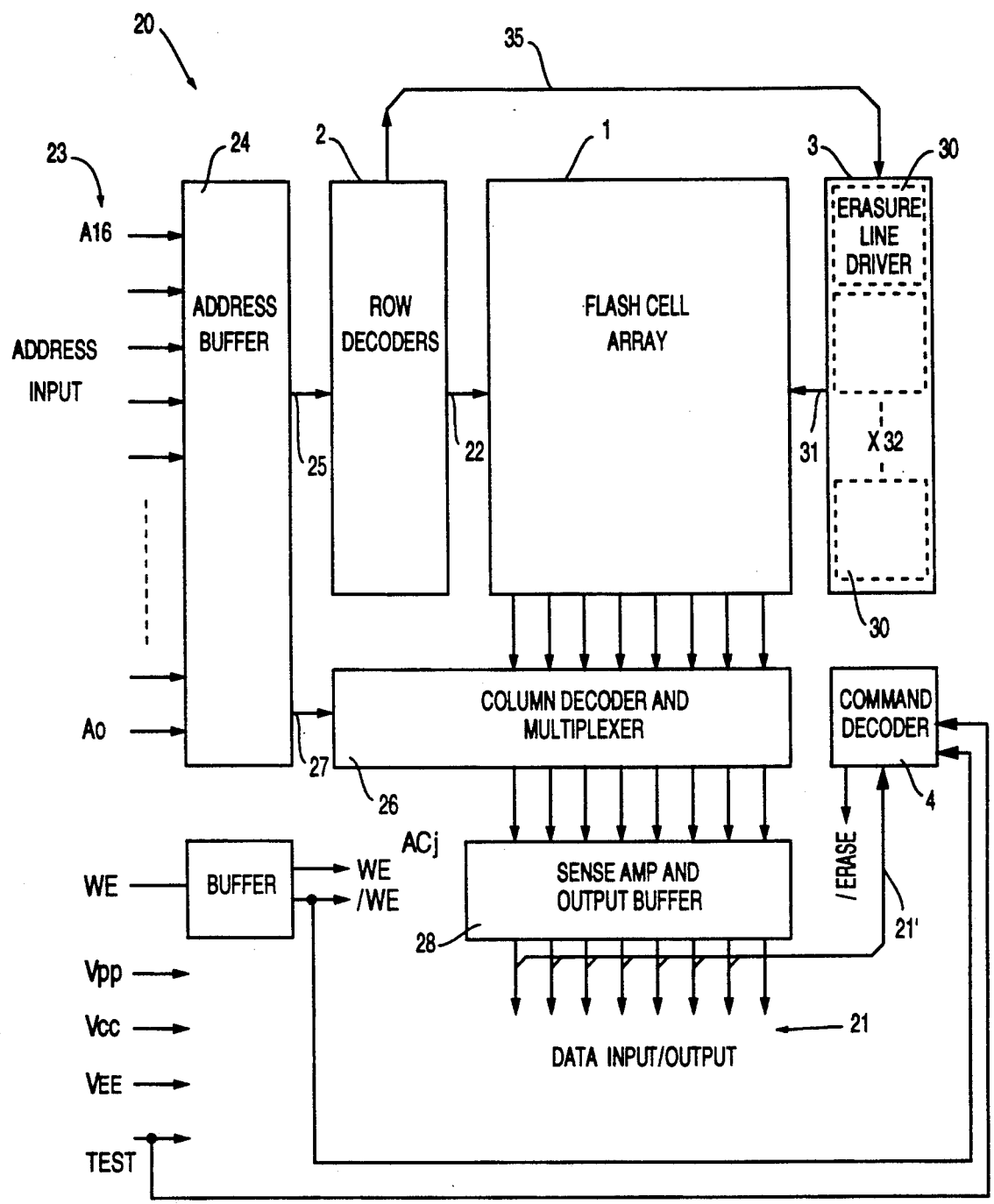
FIG. 3 is a block diagram of a 1-megabit flash-type EEPROM semiconductor memory in accordance with the present invention.

FIG. 3 is a block diagram of a 1-megabit flash-type EEPROM 20 according to the preferred embodiment of the present invention. In this embodiment, the write voltage $V_{PP}$ and the erasure voltage $V_{EE}$ are supplied directly, along the supply voltage $V_{CC}$, to the flash-type EEPROM 20 from an external circuit (not shown). A command decoder 4 is connected to a data bus 21 for the flash-type EEPROM 20 via bus line 21' and identifies a command written to the flash-type EEPROM 20 via the data bus 21 and thereby determines the internal operation state of the flash-type EEPROM 20. The internal operation states include a write operation state, read operation state, and erasure operation state. When the command decoder 4 identifies a command on the data bus 21 indicating a request for an erasure state, the /ERASE output signal of the command decoder 4 goes active. As used herein, the symbol "/" designates the logical complement of the associated signal.

The flash-type EEPROM 20 further includes a sense amplifier and output buffer 28 for providing buffered output data from the column decoder and multiplexer 26 as is illustrated.

Figure 5:
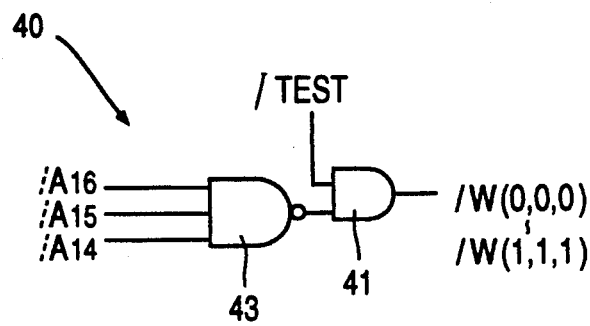
FIG. 5 is a logic diagram showing the configuration of a row predecoder in accordance with the present invention.
Figure 5:
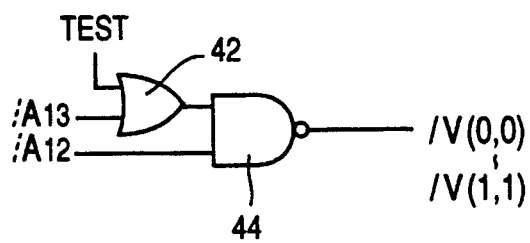
Figure 5:
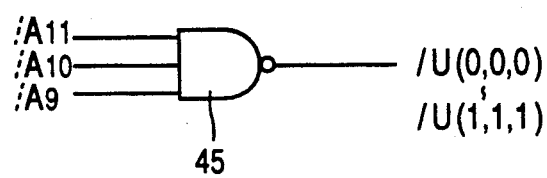
Figure 5:
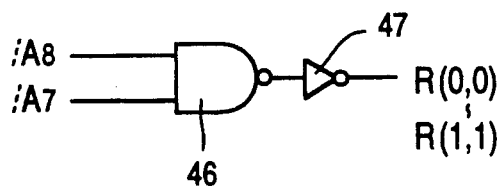
Figure 6:
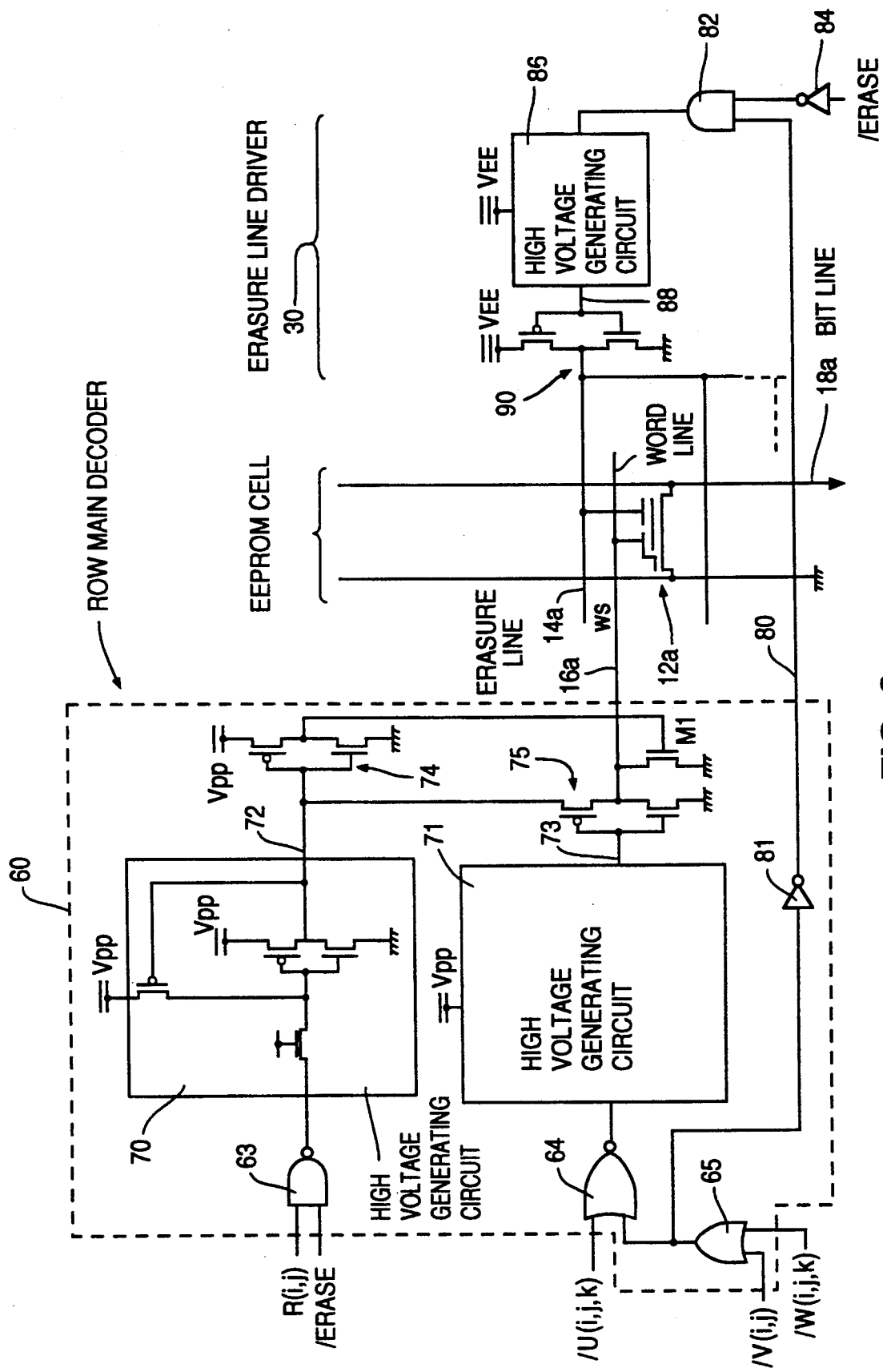
FIG. 6 is a wiring diagram showing the interconnections between a row main decoder, an EEPROM cell, and an erasure line driver in accordance with the present invention.

A row decoder 2 in the flash-type EEPROM includes row predecoders (FIG. 5) and row main decoders, (FIG. 6). There are a total of 1024 row main decoders in the exemplary embodiment. The outputs of the row main decoders (represented by line 22) are connected to the word lines (i.e., 16a, 16b) of a 1-megabit flash cell array 1 formed of cells 12 identical to the cells 12 shown in the EEPROM cell array 10.

Address information is provided to the flash-type EEPROM 20 by way of an address bus 23 comprising address lines $A_0$-$A_{16}$, for example. The signals on the address lines are buffered by address buffer 24, and a desired number of address lines (i.e., $A_7$-$A_{16}$) are provided to the row decoder 2 as represented by line 25. Similarly, a desired number of address lines (i.e., $A_0$-$A_6$) are provided to the column decoder and multiplexer 26 as represented by line 27. Accordingly, each EEPROM cell 12 in the flash cell array 1 can be accessed or selected as will be appreciated.

An erasure line driver array 3 consists of 32 erasure line drivers 30. Each erasure line driver 30 is connected to and simultaneously drives 32 erasure lines of the 1024 erasure lines (i.e., 14a, 14b) of the flash cell array 1 as represented by bus line 31. Intermediate decode signals generated in the row main decoders are supplied to the erasure line driver array 3 via bus lines 35 to drive the erasure line drivers 30.

Figure 4:
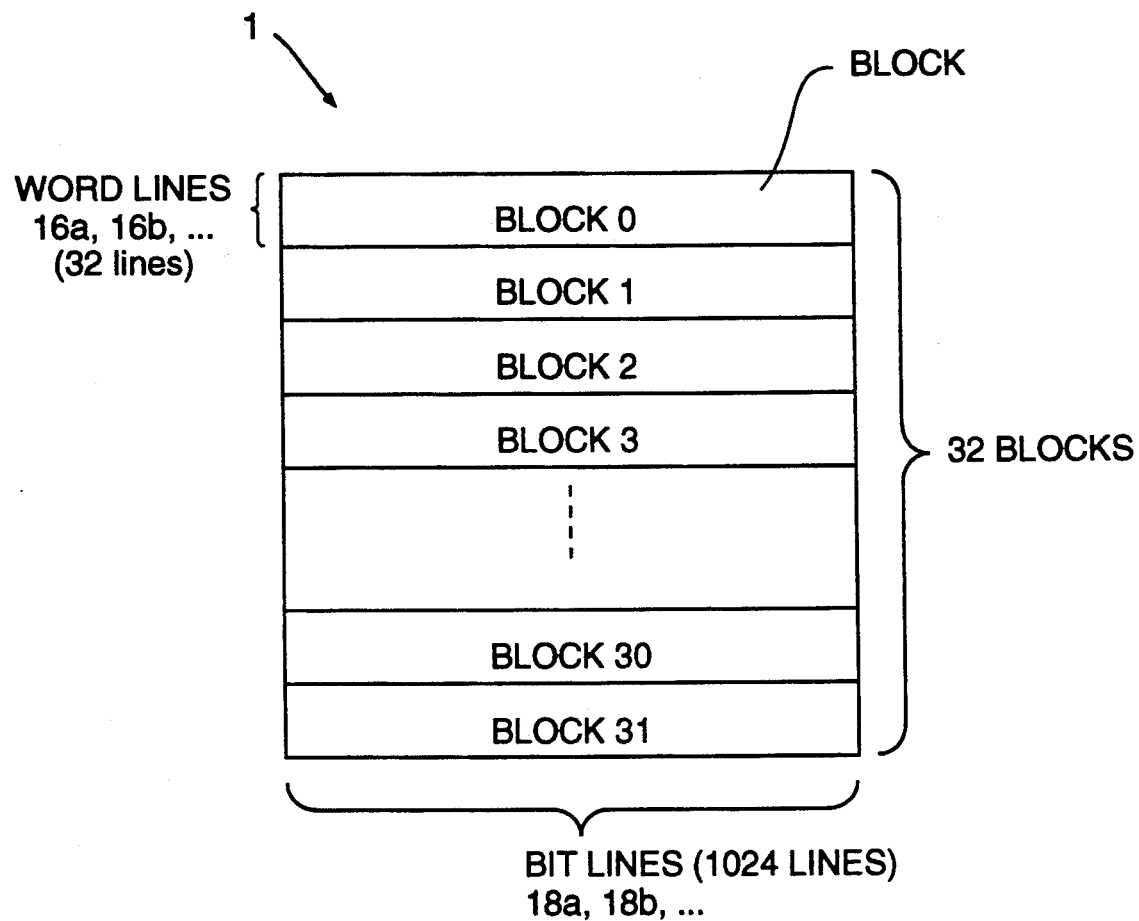
FIG. 4 is a schematic diagram showing the organization of a flash cell array formed from an EEPROM cell array in accordance with the present invention.

FIG. 4 shows the organization of the flash cell array 1. The flash cell array 1 consists of 32 blocks with each block having a plurality of EEPROM cells 12 as represented in FIG. 1. Thirty-two word lines 16a, 16b, ... etc. and 1024 bit lines 18a, 18b, ... etc. are connected to each block. Each block has associated therewith one erasure line driver 30. The respective erasure line driver 30 is driven to erase the contents of the plurality of EEPROM cells within the block as is explained in detail below.

FIG. 5 shows the configuration of an exemplary row predecoder 40 included in the row decoder 2. The row predecoder 40 comprises AND gate 41, OR gate 42, NAND gates 43-46, and an inverter 47. The row predecoder 40 receives from an external circuit (not shown) a test signal TEST at an input to OR gate 42 for erasure test. In addition, the row address input signals $A_7$-$A_{16}$ or inverted row address input signals /$A_7$-/$A_{16}$, either of which may be used without departing from the scope of the present invention, are coupled to the inputs of the NAND gates 43-46 as is illustrated. The row predecoder 40 provides output decode signals /W(i,j,k), /V(i,j), /U(i,j,k), and R(i,j) to the corresponding row main decoder exemplified in FIG. 6 (wherein i, j, and k each can take a value 0 or 1).

FIG. 6 is a wiring diagram showing the interconnections between an exemplary row main decoder 60, EEPROM cell 12a, and erasure line driver 30. The row main decoder 60 receives the corresponding output decode signals /W(i,j,k), /V(i,j), /U(i,j,k), and (R(i,j) from the row predecoder 40 (FIG. 5) and an /ERASE signal from the command decoder 4 at NAND gate 63, NOR gate 64 and OR gate 65 as is shown. The outputs of the NAND gate 63 and NOR gate 64 are connected, respectively, to the input of high voltage generating circuits 70, 71. When the respective outputs of the NAND gate 63 and NOR gate 64 are at a logic "0" state, the respective outputs 72, 73 or the high voltage generating circuits 70, 71 are at a high voltage $V_{PP}$. When the outputs of the NAND gate 63 and NOR gate 64 are at a logic "1" state, the respective outputs 72, 73 are low, i.e., zero volt.

The outputs 72, 73 of the high voltage generating circuits 70, 71 are connected to inverters 74, 75, respectively. The output of the inverter 74 is connected to the gate of transistor M1. Both the output of inverter 75 and the source of transistor M1 are connected to word line 16a as is illustrated. As a result, the row main decoder 60 outputs a word line select signal WS on word line 16a to the EEPROM cell as a function of the corresponding output decode signals.

The erasure line driver 30 is driven by intermediate decode signals that the row main decoder 60 generates on line 80 by decoding the decode signals /V(i,j) and /W(i,j,k) via the OR gate 65. The intermediate decode signals on line 80 are coupled through an inverter 81 to an input of an AND gate 82 in the erasure line driver 30. The second input of the AND gate 82 consists of the /ERASE signal as inverted by inverter 84. The output of AND gate 82 is connected to the input of a high voltage generating circuit 86. When the input to the high voltage generating circuit 86 is high, its output on line 88 is a logic low. Inverter 90 provides the appropriate inversion such that a logic high signal (i.e., $V_{EE}$) at the inverter output is provided to the erasure line 14a. It will be noted that all of the high voltage generating circuits in the present invention may include circuitry identical to that which is shown in high voltage generating circuit 70. The row decoder 2, which consists of the row predecoders and row main decoders, thus also functions as an erasure block decoder which drives the selected line drivers 30 during erasure operation testing.

In the above configuration, for a read operation, the row predecoder 40 generates the decode signals /U(i,j,k), /V(i,j), /W(i,j,k), and R(i,j) corresponding to the address input signals supplied for the EEPROM flash cell array 1 from which to read data. The generated decodes signals /W(i,j,k), /V(i,j), /U(i,j,k), and R(i,j) are supplied to the row main decoder 60 as illustrated in FIG. 6. In response, the row main decoder 60 outputs a word line select signal WS on the appropriated word line (i.e., 16a) to select the word line connected to the EEPROM cell (i.e., 12a) from which to read data. At this time, all erasure lines (i.e., 14a) are placed in a non-select state (i.e., 0 volt) as a result of the inverter 84, AND gate 82, high voltage generating circuit 86, inverter 90, combined with the /ERASE signal supplied from the command decoder 4 going "high".

For a block erasure operation, the row precoder 40 generates the decode signals /W(i,j,k), /V(i,j), /U(i,j,k), and R(i,j) corresponding to the address input signals for the block selected from the flash cell array 1 for erasure and supplies the decode signals to the row main decoder 60. In response, the row main decoder 60 generates intermediate decode signals by decoding the decode signals /W(i,j,k), and /V(i,j), input at OR gate 65, to drive via line 80, for example, the erasure line driver 30 corresponding to the block whose contents are to be erased. In this context, it can be said that the OR gate 65 serves as an erasure line decoder, each block having its own decoder.

During the block erasure operation, the /ERASE signal supplied from the command decoder 4 is in an active "low" state. Thus, both inputs of the AND gate 82 will be "high", resulting in the output of the inverter 90 at the erasure line 14a being high ($V_{EE}$ volts). Accordingly, the erasure line driver 30 erases the contents of the plurality of EEPROM cells within the block. At this time, all word lines such as 16a are placed in a non-select state (i.e., 0 volt) by the /ERASE signal supplied from the command decoder 4. More particularly, when the /ERASE signal is in an active state, the output of the NAND gate 63 will be a logic "high". The output of the high voltage generating circuit 70 will be a non-select state of "low" as a result. The combination of the inverters 74, 75 and the transistor M1 ensure that the word line 16a remains at zero volt.

In a test mode, to test the block erasure operation, an erasure command is written into the flash-type EEPROM 20 via the data bus 21. As a result, the command decoder 4 outputs the /ERASE signal to place all word lines in a non-select state irrespective of the respective states of signals R(i,j), /U(i,j,k), /V(i,j) and /W(i,j,k), as in the case of a block erasure operation as is described above. Simultaneous to the application of the erasure command, the test signal TEST is applied to the OR gate 42 in the row predecoder 40 shown in FIG. 5. In FIG. 5, since /TEST will be low, /W(i,j,k) from the AND gate 41 will always be low. The signal /V(i,j) from the output of NAND gate 44 will be the inverted value of $A_{12}$, the signal /V(i,j) being coupled to the input of OR gate 65 as described above. The address input signal $A_{12}$ is therefore transferred to the erasure line driver 30 through the row predecoder 40 and row main decoder 60 in the row decoder 2 which also functions as an erasure block decoder.

As is described above, in the usual block erasure operation, the erasure line drivers 30 are controlled in such a manner that $A_{12}$-$A_{16}$ are decoded and any one of the 32 erasure line decoders (i.e., OR gate 65) is selected. However, in the test mode, the erasure line drivers are controlled only by $A_{12}$. That is, $A_{13}$-$A_{16}$ are disregarded. For example, when $A_{12}$ is low, all the odd-numbered erasure line drivers are selected and all the even-numbered erasure line drivers are not selected. When $A_{12}$ is high, the select conditions are reversed. Therefore, it is sufficient to perform the test operation twice for high and low states of $A_{12}$.

Therefore, when the address input signal $A_{12}$ is "0", all the even-numbered erasure line drivers 30 in the erasure line driver array 3 are driven; when the address input signal $A_{12}$ is "1", all the odd-numbered erasure line drivers 30 in the erasure line driver array 3 are driven. Accordingly, the erasure operation tests of all the blocks corresponding one-to-one to the erasure line drivers can be completed in two erasure operations, one for the even-numbered blocks and the other for the odd-numbered blocks. This means that the erasure operation test of all the blocks can be completed in about two seconds, which is a drastic reduction in the erasure operation test time compared with the prior art that requires testing the blocks one by one. This serves to reduce the cost of the erasure operation test. Furthermore, since the above erasure operation test is performed on alternate blocks, it is also possible to check that there is no interference between adjacent blocks. Moreover, since the row decoder 2 which operates during a read operation also functions as an erasure block decoder, the operation of the row decoder 2 which has the dual function can be tested during a read test. Thus, the operation of the internal circuitry of the flash-type EEPROM can be tested in a very efficient manner.

In the above described example, the erasure line drivers are divided into two groups, a group corresponding to the even-numbered blocks and a group corresponding to the odd-numbered blocks. It will be appreciated, however, that other type groupings may be employed with the corresponding logic. For example, the erasure line drivers may be divided into two groups where the first group includes the first sixteen erasure line drivers and the second group includes the second sixteen erasure line drivers.

In the above embodiment, the write voltage $V_{PP}$ and the erasure voltage $V_{EE}$ are supplied directly to the flash-type EEPROM from an external circuit, but an internal generator circuit to which the supply voltage $V_{CC}$ is applied may be provided in the flash-type EEPROM so that the write voltage $V_{PP}$ and the erasure voltage $V_{EE}$ may be generated by the internal generator circuit.

As is apparent from the above description, according to the semiconductor memory of the invention, when an external test signal is given, an erasure block decoder provided in the row decoder outputs a signal for simultaneously driving all the even-numbered erasure line drivers in an erasure line driver array, or a signal for simultaneously driving all the odd-numbered erasure line drivers in the erasure line driver array, according to an externally applied address signal. Therefore, the erasure operation test of all the blocks corresponding one-to-one to the erasure line drivers can be completed in two erasure operations, one for the even-numbered blocks and the other for the odd-numbered blocks. Thus, the present invention achieves a reduction in the erasure operation test time and thence in the erasure operation test cost, compared with the prior art that requires testing the blocks one by one.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory comprising:
   an EEPROM cell array having a plurality of blocks each consisting of a plurality of EEPROM cells;
   an erasure line driver array having a plurality of erasure line drivers corresponding one-to-one to said blocks for selectively erasing the contents of the EEPROM cells in the corresponding blocks; and
   a row decoder for decoding an external address signal and thereby selecting a particular EEPROM cell during a read operation and driving a selected erasure line driver during a block erasure operation, said row decoder having an erasure block decoder which, when an external test signal is given, outputs a signal for simultaneously driving a first plurality of said erasure line drivers in said erasure line driver array, or a signal for simultaneously driving a second plurality of said erasure line drivers in said erasure line driver array, according to an externally applied address signal;
   said first plurality of said erasure line drivers comprising all even-numbered erasure line drivers, and said second plurality of said erasure line drivers comprising all odd-numbered erasure line drivers.

2. The semiconductor memory of claim 1, wherein each of said first and second plurality of erasure line drivers is driven to erase the contents of substantially one-half of said plurality of EEPROM cells.

* * * * *